Sept. 8, 1970 F. D. RANDO 3,528,020

VOLTAGE REGULATED SIGNAL TRANSLATING CIRCUIT

Filed April 1, 1968

INVENTOR
Frederic D. Rand
BY H. Christoffersen
ATTORNEY

United States Patent Office 3,528,020
Patented Sept. 8, 1970

3,528,020
VOLTAGE REGULATED SIGNAL TRANSLATING CIRCUIT

Frederic D. Rando, Cherry Hill, N.J., assignor to RCA Corporation, a corporation of Delaware Filed Apr. 1, 1968, Ser. No. 717,673
Int. Cl. H03f *3/42*; H03g *3/30*
U.S. Cl. 330—25 8 Claims

ABSTRACT OF THE DISCLOSURE

A circuit comprising two active devices connected in series and operated in the unity voltage gain configuration. One of the two devices is in the signal conduction path and drives the load. The other device is used to absorb the change in voltage due to either the signal input or to the power supply variation. The voltage across the signal translating device is regulated over the full range of operation, thereby minimizing variations in its parameters and ensuring a high fidelity of signal transmission.

BACKGROUND OF THE INVENTION

A grounded collector amplifier, or emitter follower, is ideally suited for directly coupling a high impedance signal source to a low impedance resistive and/or capacitive load. The voltage level at the emitter follows the voltage level present at the base, minus the forward voltage drop of the base-to-emitter junction ($V_{BE}$) of the transistor. In a direct coupled system, maintaining a parameter such as $V_{BE}$ constant is of extreme importance since any deviation or change from its initial value is indistinguishable from an input signal and results in false output information. The base-to-emitter junction voltage ($V_{BE}$) is temperature dependent having a negative temperature coefficient in the range of two millivolts per degree centigrade. Therefore, if the transistor junction temperature rises, whether due to an increase in the ambient temperature or to internal heating due to excessive power dissipation, the base-to-emitter junction voltage decreases, causing the emitter voltage to rise. This simulates the presence of a signal though none is present. The need to minimize power dissipation, however, is in opposition to other design requirements described below.

Where the emitter follower is to operate over a frequency range stretching from D.C. to several megacycles, great pain must be taken to minimize the effect of junction capacitances. Since the collector-to-emitter junction capacitance varies inversely as a function of collector-to-emitter voltage, the supply voltage must be made large in comparison to the maximum signal level in order to maintain adequate phase and gain linearity. In addition, where the emitter follower must drive a large load capacitance, it must be capable of providing large currents to charge and/or discharge the load capacitance.

In order to meet these requirements in prior art circuit arrangements, the transistor dissipation, which equals the product of the collector current ($I_c$) and the collector-to-emitter voltage ($V_{CE}$), is large. The power dissipation generates heat resulting in a rise in the transistor junction temperature, causing a shift of the emitter output voltage level.

It is an object of this invention to provide an improved circuit arrangement wherein the voltage across the conduction path of the signal translating device may be regulated and kept substantially constant. This enables the selection of a much lower value of supply voltage across the signal translating device, resulting in a considerable decrease in its power dissipation. Thus, the temperature dependent, as well as the voltage dependent, parameter variations are minimized.

BRIEF SUMMARY OF THE INVENTION

In circuits embodying the invention two active devices, operated in the follower output mode, are connected in series in the unity voltage gain configuration. One of the two devices is used to translate the signal input to the output, and the other is used to absorb any voltage change across the first device due to either signal input or power supply variations. The control electrodes of the two devices are coupled by a level shift means which provides for a direct current (D.C.) offset between the two control electrodes as well as furnishing a low alternating current (A.C.) path therebetween. The D.C. offset voltage equals the voltage across the conduction path of the signal translating device, said voltage being maintained substantially constant over the full range of signal input and power supply variation.

DETAILED DESCRIPTION

Figures 1, 2:
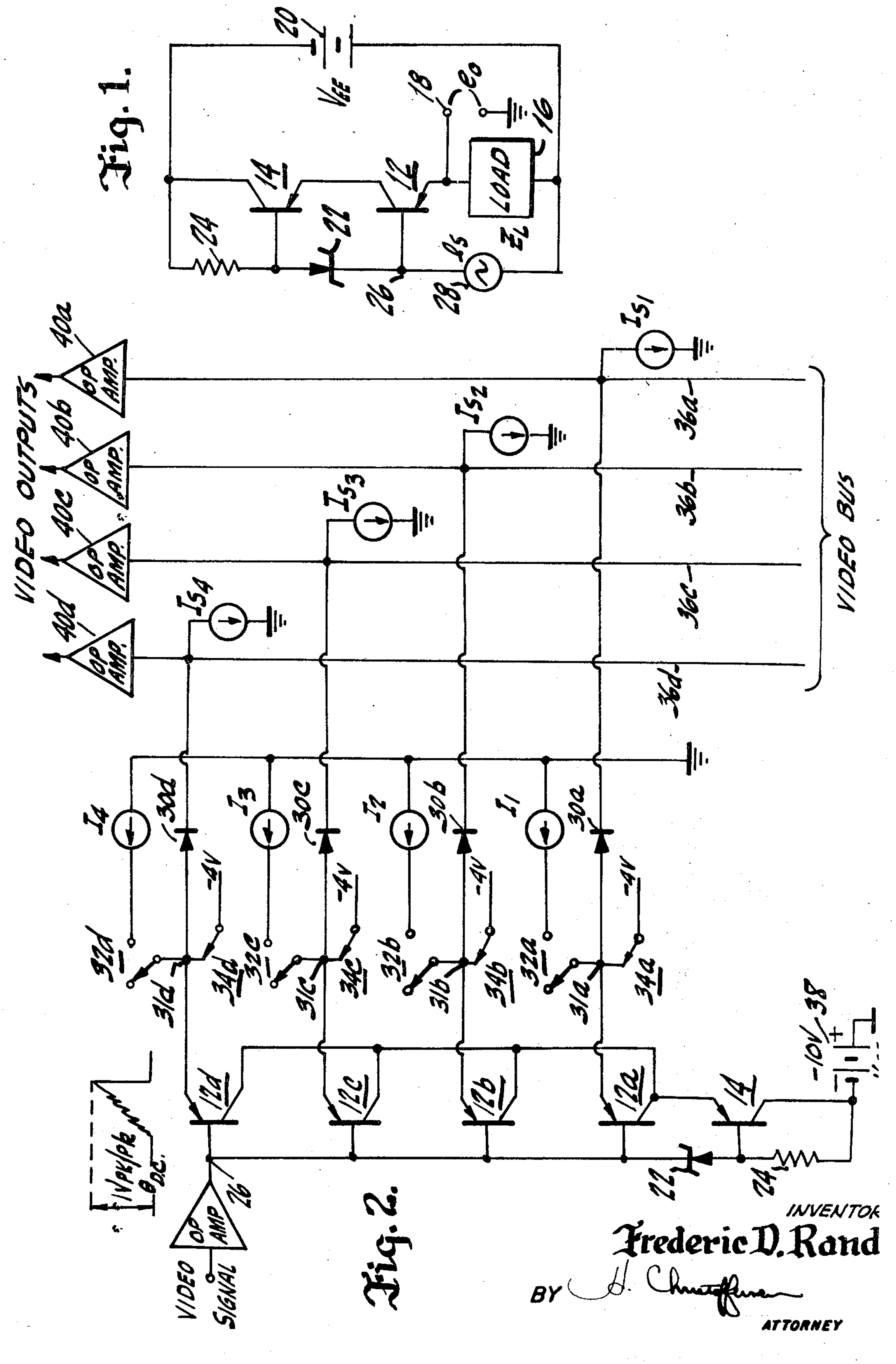
FIG. 1 is a schematic drawing of an emitter follower circuit embodying the invention.
FIG. 2 is a schematic drawing of a television program switcher embodying the invention.

An emitter follower is a common collector amplifier with the load located in the emitter leg. An emitter follower is also called a grounded collector stage but the latter term will be used in this application only when the collector of the emitter follower stage is connected by a negligible impedance to the source of operating potential. The current gain of the emitter follower is equal to the short circuit forward current gain ($h_{fe}+1$). The input impedance of the emitter follower is equal to the emitter impedance multiplied by the gain factor ($h_{fe}+1$).

The output impedance for intermediate values of input source impedance will be very low. Thus, the emitter follower acts as an impedance transformer to match a source of high impedance to a load circuit of low impedance.

For usual values of load impedance the voltage gain will be less than but near unity. The emitter follower configuration thus may be called, with very little error, a unity voltage gain configuration. The output voltage nearly equals the input voltage, with the emitter voltage following the input voltage. The emitter follower is thus an ideal configuration for impedance matching and direct coupling of signal sources to low impedance and capacitive loads.

Direct coupling through a preferred means of connecting system components, has the inherent disadvantage that leakage and drift become part of the signal and cannot be differentiated therefrom. This mode of operation thus imposes a severe limitation on the permissible $V_{BE}$ variations of a direct coupled emitter follower.

Another disadvantage of emitter followers which becomes pronounced at intermediate and high frequencies, is caused by the variation in the collector-to-emitter voltage ($V_{CE}$) of the transistor with the application of signal input and the ensuing variation in the collector-to-base junction capacitance, which in addition to limiting the upper range of frequency operation can cause positive feedback and undesirable oscillations. Though the capacitance of the emitter follower is low, it should be noted that the capacitance varies inversely with reverse voltage and therefore the shunt capacitance will be maximum when the signal input is largest (i.e. minimum $V_{CE}$) giving maximum coupling when least desired. Operating, as in the prior art, with reverse voltages which are large in comparison to the largest input signal minimizes the junction capacitance and the effect of its variations but aggravates the problem of excessive power dissipation with its deleterious effect on the $V_{BE}$ of the emitter follower.

Circuits embodying the invention, on the other hand, maintain the collector-to-emitter voltage ($V_{CE}$) of the emitter follower substantially constant over the full range of signal input and power supply variation. Keeping $V_{CE}$ substantially constant maintains the gain and phase substantially constant over the frequency range of operation. This permits lowering the voltage across the device with a resulting decrease in power dissipation since the current level is unchanged. The effect is to reduce the parameter variations due to temperature dependence.

The problem and its solution is further illustrated by referring to FIG. 1. The emitter follower amplifier shown in FIG. 1 comprises a totem pole arrangement which includes a first transistor 12 of one conductivity type, illustrated as PNP type, connected in series with a second transistor 14 of the same conductivity type and a series load represented by load impedance 16. The emitter of transistor 12 is connected to output terminal 18 and to one end of load impedance 16. The collector of transistor 12 is connected to the emitter of transistor 14 whose collector is connected to a source of potential 20 which has a polarity to reverse bias the base-to-collector junctions of transistor 14 and transistor 12. The bases of transistors 12 and 14 are coupled to each other by means of Zener diode 22 whose anode is connected in common with one end of resistor 24 and the base of transistor 14, and whose cathode is connected in common to input terminal 26 and the base of transistor 12. The other end of resistor 24 is connected in common to the collector of transistor 14 and the negative terminal of source potential 20. Resistor 24 provides a D.C. path for the base current of transistor 14 and the Zener diode current. Input terminal 26 permits connection of a source 28 of signal to the amplifier circuit.

A quantitative analysis of the circuit shows that the avalanche breakdown voltage, or the Zener breakdown voltage, ($V_Z$) of diode 22 will be the value of voltage appearing across the collector-to-emitter junction of transistor 12 under all operation conditions. Assuming the voltage level at the base of transistor 12 to be some arbitrary voltage $V_B$, that level will be shifted an amount $V_Z$ by diode 22. The voltage at the base of transistor 14 will therefore be $[V_B-V_Z]$. The base-to-emitter junction of transistors 12 and 14 will be biased in the forward conduction mode so long as the value of source 20 potential $V_{EE}$ is greater than $V_Z$ and it may be assumed that the $V_{BE}$ of transistor 12 equals the $V_{BE}$ of transistor 14. Therefore, the emitter of transistor 12 will be at a voltage level equal to $[V_B+V_{BE}]$ and the emitter of transistor 14 will be at a voltage level equal to $$[V_B-V_Z+V_{BE}]$$

Since the emitter of transistor 14 is shorted to the collector of transistor 12, it is obvious that the $V_{CE}$ of transistor 12 will equal $V_Z$. Thus, by use of the diode 22 to shift the voltage level present at the base of transistor 12 and by means of emitter follower transistor 14 to couple the shifted voltage level to the collector of transistor 12, the emitter-to-collector voltage of transistor 12 is set equal to $V_Z$.

Note that the voltage level across the collector-to-emitter junction of transistor 12 will be well regulated regardless of variations in $V_{EE}$ so long as $V_{EE}$ is kept greater than $V_Z$. Furthermore, if the signal source 28 impedance is low, any variation in the power supply will appear across transistor 14, which thus absorbs all variations. Since transistor 14 does not appear in the signal path, any variation in the parameters of transistor 14 will only have a minor effect on the processing of the signal. Having determined the stability of $V_{CE}$ with variations in the D.C. supply, it now will be shown that the $V_{CE}$ of transistor 12 remains constant with input signal.

Any signal applied at the base of transistor 12 will appear at the emitter of transistor 12 and, since the Zener diode has an extremely low A.C. impedance, the same signal will appear with very little attenuation at the base of transistor 14 from where it will be coupled to the collector of transistor 12 in phase with the signal applied at the emitter of transistor 12. Thus, the collector-to-emitter voltage ($V_{CE}$) of transistor 12 remains constant even though it may be shifted up or down with respect to a point of reference potential.

It should be noted that the Zener diode may be replaced, for example, by a floating battery connected between the bases of transistors 12 and 14, or by the parallel combination of a resistor and a capacitor or by means of a plurality of diodes stacked in series to produce a set level shift or offset voltage.

Vacuum tubes, bipolar devices or insulated-gate field-effect transistors (IGFET's) are suitable for use in practicing the invention. Vacuum tubes may be connected in the well-known cathode follower configuration to produce similar results to the ones described. PNP devices have been used to illustrate the invention, but it should be obvious to any one skilled in the art that NPN devices are just as suitable to practice the invention. Also, IGFET's may be connected in the source follower mode to achieve the results described. The important characteristics of all these active devices are similar when operated in what may be generally called the "Follower Output Mode." They all exhibit high input impedance, low output impedance, close to unity voltage gain and the ability to be connected in series as taught by the invention, and, when connected as per the invention the output "follows" the input.

In FIG. 2, the invention is shown in an environment wherein the circuit is used in television program switching equipment. They system shown includes a matrix comprising four identical signal translation circuits sharing the same voltage regulator circuit and the same source of video input signals. The matrix arrangement permits routing the video input signal onto any one of four output lines **36*a* . . . 36*d***. Since all four circuits are identical only one circuit will be described in detail. Similar components in the several circuits are denoted by like reference numbers, with alphabetic letters denoting the particular circuit.

The cross point **31*a*, defined as the junction of the emitter of transistor 12*a* and diode 30*a*, is in the conduction state when the switch 32*a* for the $I_1$ current generator is closed and the switch 34*a* to the —4 volts supply is opened. The current generator $I_1$ then supplies bias current to both the transistor 12*a* and the diode 30*a*. The $I_{s1}$ current generator always operates and is used to divide the $I_1$ generator current between the diode and the transistor. When the switch 32*a* is closed and switch 34*a* is open, the video signal path is through the emitter follower 12*a*, diode 30*a*, onto the video bus 36*a* and then to the output amplifier 40*a***.

Before being selected the signal translating transistor **12*a* . . . 12*d*** is "off," dissipating no power. Upon being switched "on," the device conducts a collector current $I_c$ at a certain potential $V_{CE}$ across its collector-to-emitter. The power dissipation due to this step of power causes the junction temperature to rise exponentially. Transistor temperature dependent parameters respond to the change. The $V_{BE}$ of the conducting emitter follower shinks with a negative temperature coefficient at a rate of approximately two millivolts per °C. This causes the D.C. reference level at the emitter to change, resulting in undesirable disturbances in the video output signal. Depending on the speed of the temperature rise, a flicker or smudge will be seen on a TV screen due to the change in luminescence caused by the variation in the D.C. level at the output of the emitter follower.

The benefits of the invention may be seen when the circuit using the invention is compared with a circuit of the prior art. Without the use of the present invention the collectors of transistors 12*a*, 12*b*, 12*c* and 12*d* would be returned directly to the −10 volts negative supply 38. Since the video bus 36*a* presents a capacitive load of 150 picofarads, the emitter follower 12*a* must be biased with a fairly substantial emitter current (e.g. 10 ma.) or the cross point 31*a* will go into frequency selective clipping. In addition, in order to maintain adequate phase and gain linearity in the grounded collector configuration, a $V_{CE}$ of about 10 volts is needed. This results in a transistor dissipation of 100 milliwatts, which results in a temperature rise causing the emitter-to-base voltage ($V_{BE}$) to change by approximately 45 millivolts, or 4.5% of a one (1) peak-to-peak video signal.

By incorporating the invention as shown in FIG. 2 and using the voltage regulation circuit comprising emitter follower 14, resistor 24, and Zener diode 22 it is possible to lower the $V_{CE}$ of the signal translating emitter followers (12*a* . . . 12*d*) to about three volts. The power dissipation is thus reduced to 30 milliwatts, which reduces the thermal drift of the base-to-emitter voltage ($V_{BE}$) of the signal translating device to under 15 millivolts or less than 1.5% of the one (1) volt peak-to-peak signal.

In addition, the collector-to-emitter voltage of the signal processing stage remains constant, independent of varying input signal. Thus there is no decrease of $V_{CE}$ as the signal increases. This ensures that there is no increase in junction capacitance with its deleterious effect on the frequency response. Thus, in addition to decreasing power dissipation, maintaining a regulated voltage across the signal translating emitter follower transistor produces gain and phase linearity which is superior to that obtainable with a single grounded collector transistor.

What is claimed is:

1. The combination comprising:
first and second active devices each connected in a follower output configuration and each having a control electrode and first and second electrodes defining a conduction path;
output load means connected at one end to the first electrode of said first active device, the second electrode of said first active device being connected to the first electrode of said second active device;
means for connecting a source of signal to the control electrode of said first active device;
a resistor having one end connected to the control electrode of said second active device;
means for connecting the other end of said resistor, the second electrode of said second active device and the other end of said load means to points of suitable operating potential; and
level shift means coupled to said control electrodes of said first and second active devices for coupling said source of signal to said control electrode of said second active device and for regulating the conductivity of said second active device such that the operating voltage across said first and second electrodes of said first active device is maintained substantially constant over the voltage range of said source signals and variations in said operating potential.

2. The combination as claimed in claim 1,
wherein said first and second active devices are transistors each having a base, an emitter and a collector, wherein the base is said control electrode, the emitter is said first electrode, and the collector is said second electrode.

3. The combination as claimed in claim 1,
wherein said first and second active devices are semiconductor devices of the same conductivity type.

4. The combination as claimed in claim 2,
wherein the level shift means provides a substantially constant value of voltage between the control electrodes of said first and second active device.

5. The combination as claimed in claim 4,
wherein said level shift means reduces to an equivalent circuit represented by a source of substantially constant potential exhibiting a low A.C. source impedance, said level shift means determining the value of voltage across said first active device, and said value of voltage across said first active device being substantially equal to the value of voltage of said source of substantial constant potential.

6. The combination as claimed in claim 2,
wherein said level shift means is a Zener diode connected to conduct current in the reverse direction.

7. The combination as claimed in claim 2,
wherein the points of suitable operating potential are of a polarity to forward bias the base-to-emitter junctions and to reverse bias the collector-to-base junctions of said first and second transistors.

8. The combination comprising:
first and second transistors each having a control electrode and first and second electrodes defining a main conduction path;
a load;
means for coupling said load and said transistors in series relationship and to a source of operating potential such that current is supplied to said load through said main conduction paths;
a source of input signals;
means coupling said source of input signals to said control electrode of said first transistor; and
level shift means coupled to said control electrodes for coupling said input signals to said control electrode of said second transistor and for regulating the conductivity of said second transistor in response to said input signals and to variations in said operating potential such that the operating voltage across said first and second electrodes of said first transistor is maintained substantially constant.

References Cited

UNITED STATES PATENTS 3,426,289 2/1969 Uppal ---------------- 330—22

ROY LAKE, Primary Examiner

L. J. DAHL, Assistant Examiner

U.S. Cl. X.R.

330—18, 30

UNITED STATES PATENT OFFICE
CERTIFICATE OF CORRECTION

Patent No. 3,528,020 Dated September 8, 1970

Inventor(s) Frederic D. Rando

It is certified that error appears in the above-identified patent and that said Letters Patent are hereby corrected as shown below:

Column 4, line 35, that portion reading "They" should read -- The -- .
Column 4, line 36, that portion reading "translation" should read -- translating -- .
Column 4, line 64, that portion reading "shinks" should read -- shrinks -- .

The following references should be included in the References Cited Section:

| | | | |
|---|---|---|---|
| 3,053,997 | 9/1962 | Cobbold----------- | 330-32X |
| 3,328,713 | 6/1967 | Ito et al--------- | 330-24X |

SIGNED AND SEALED NOV 24 1970

(SEAL)
Attest:

Edward M. Fletcher, Jr.
Attesting Officer

WILLIAM E. SCHUYLER, JR.
Commissioner of Patents